United States Patent [19]
Pelly et al.

[11] Patent Number: 5,818,214
[45] Date of Patent: Oct. 6, 1998

[54] BUCK REGULATOR CIRCUIT

[75] Inventors: Brian R. Pelly, Palos Verdes Estates; Yi Zhang, El Segundo, both of Calif.

[73] Assignee: International Rectifier Corporation, El Segundo, Calif.

[21] Appl. No.: 783,189

[22] Filed: Jan. 15, 1997

[51] Int. Cl.$^6$ .................................................. G05F 1/44
[52] U.S. Cl. ........................................... 323/351; 323/282
[58] Field of Search ................................... 323/271, 282, 323/283, 284, 299, 349, 351

[56] References Cited

U.S. PATENT DOCUMENTS

| | | | |
|---|---|---|---|
| 4,258,309 | 3/1981 | Ohsaka et al. | 323/287 |
| 5,455,758 | 10/1995 | Pelly | 363/47 |
| 5,481,178 | 1/1996 | Wilcox et al. | 323/287 |
| 5,545,955 | 8/1996 | Wood | 315/224 |
| 5,610,503 | 3/1997 | Fogg et al. | 323/283 |

FOREIGN PATENT DOCUMENTS

96 10287  4/1996  WIPO .

*Primary Examiner*—Peter S. Wong
*Assistant Examiner*—Y. J. Han
*Attorney, Agent, or Firm*—Ostrolenk, Faber, Gerb & Soffen, LLP

[57] ABSTRACT

A buck regulator circuit provides a low voltage, e.g., about 15 V, power source, directly from a variable high-voltage dc bus voltage that varies from 250 V to about 450 V. A monolithic gate driver circuit is used to drive the switching device, e.g., a MOSgate transistor, which delivers the high voltage dc to the load output node via a charging inductor for controlled time periods. The control principle for controlling the on and off times of the transistor (with the monolithic gate driver circuit) relies on turning on the transistor for fixed time periods that are equal to the intrinsic delay of the gate driver circuit. In contrast, the off period of the switching device is varied to regulate and maintain the output voltage at a constant value, independent of the input dc bus voltage or of the output current.

13 Claims, 16 Drawing Sheets

FIG. 5A $V_{DC}$ = 400V. $I_0$ = 37mA.
FREQUENCY ≈ 49kHz

FIG. 5B

FIG. 6A $V_{DC} = 400V.$   $I_O = 150mA.$
FREQUENCY ≈ 67kHz

START-UP WAVEFORMS  $V_{DC} = 400V$
TOTAL START-UP TIME ≈ 3ms

BUCK REGULATOR CIRCUIT

CROSS REFERENCE TO RELATED APPLICATION

Under the provisions of 35 U.S.C. §120, this application claims priority to related U.S. Provisional application No. 60/010,218, filed Jan. 18, 1996 and entitled BUCK REGULATOR CIRCUIT.

BACKGROUND OF THE INVENTION

This invention relates to a power regulator circuit and, more particularly, to a buck regulator converter circuit for converting a high voltage supply to a low voltage power source.

Drivers and associated control circuits for pulse width modulator (PWM) inverters for motor control and other applications require a 15 V power source, referenced to the negative dc rail.

SUMMARY OF THE INVENTION

Accordingly, it is an object of the present invention to provide a reliable and effective power regulator circuit.

It is a further object of the present invention to provide a buck regulator circuit that is capable of converting a variable high voltage dc bus input into a regulated low voltage dc output.

The foregoing and other objects of the invention are attained by a buck regulator which delivers the required 15 V power source by deriving the power therefor directly from the dc bus voltage via the buck regulator.

The present invention is realized by using existing electronic components such as the IR 2152, the IRFU120 HEXFET®, and associated circuitry. The IR 2152 and IRFU120 HEXFET® are power semiconductor products manufactured by International Rectifier Corporation of El Segundo, Calif., the assignee of the present application.

The IR 2152 driver is a monolithic MOSgate driver which enables driving both a low side and high side power MOSFET and/or IGBT transistor pairs (or any other MOSgate type devices) from logic level, ground referenced inputs. A monolithic MOSgate driver which is similar to the aforementioned IR 2152 is disclosed in the present Assignee's U.S. Pat. No. 5,545,955 which issued Aug. 13, 1996 and the contents of which are incorporated by reference herein.

The buck regulator circuit of the present invention delivers a regulated 15 V 100 mA dc output from a variable 250 V to 450 V dc bus.

Other features and advantages of the present invention will become apparent from the following description of the invention which refers to the accompanying drawings.

DETAILED DESCRIPTION OF THE PREFERRED EMBODIMENTS

Figure 1:
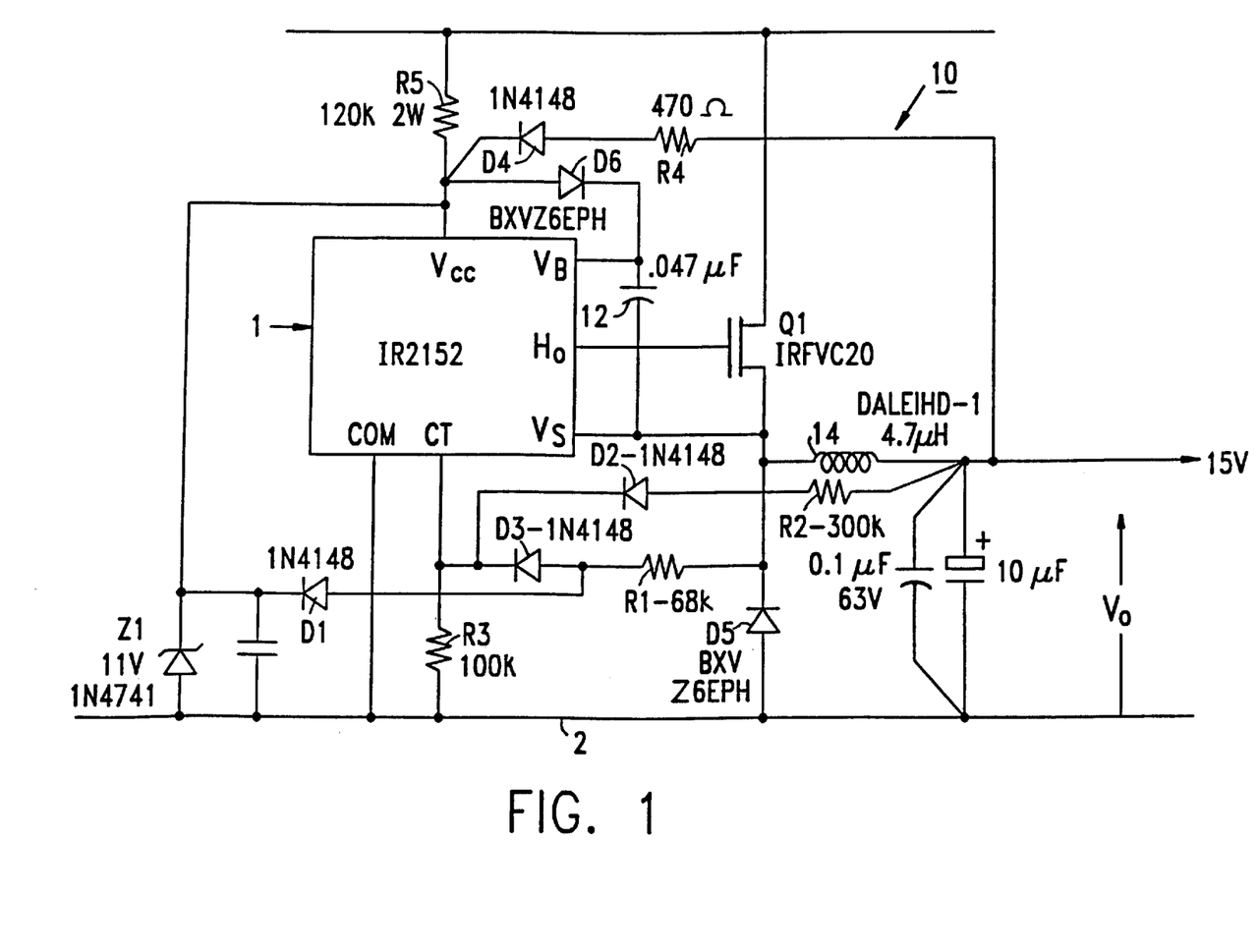
FIG. 1 is a circuit diagram of a first embodiment of the present invention.
Figure 12:
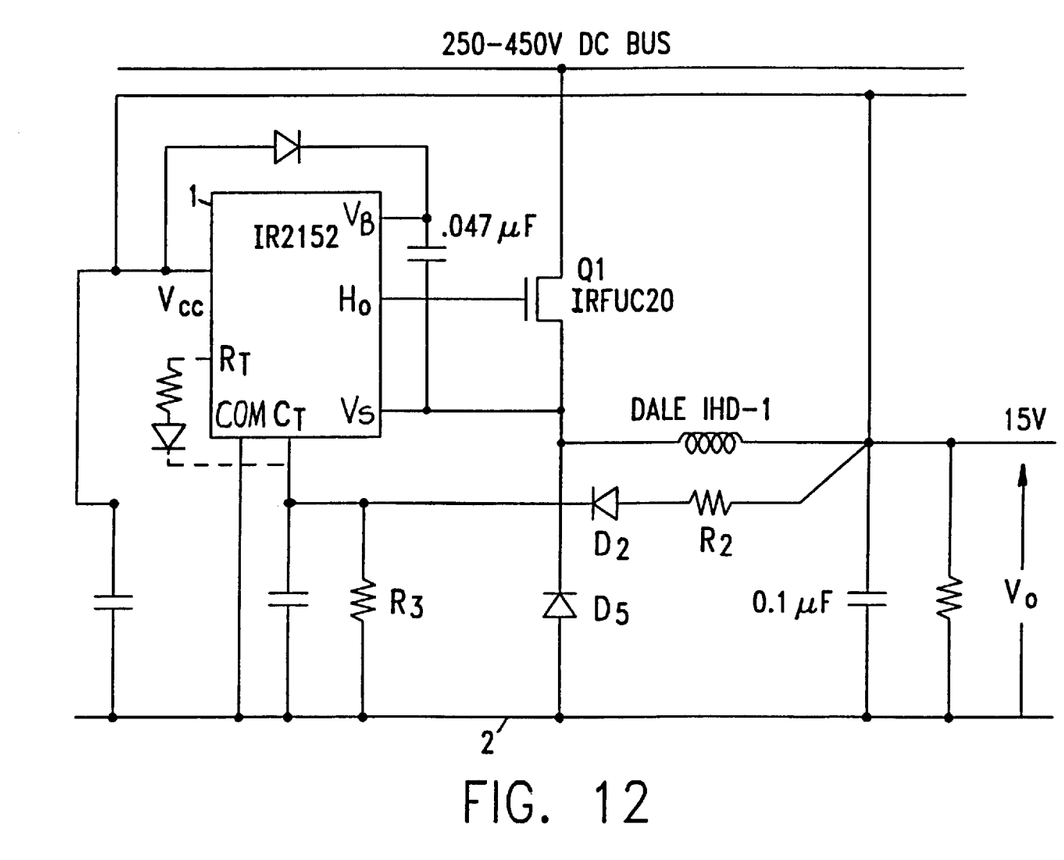
FIG. 12 shows a circuit diagram of a second embodiment of the present invention.

A circuit diagram of a first embodiment of the present convention is shown in FIG. 1. The IR 2152 chip or integrated circuit 1 is a chip of the type which may be housed in a dual in-line package or a surface-mount package and which can include the following pinouts:

$H_O$—an output pin for driving the gate of the high side MOSFET;

$V_S$—a pin to be connected to the center tap of the totem-pole or half bridge connected MOSFETs;

$L_O$—an output pin for driving the gate of the low side MOSFET (not shown);

COM—a pin connected to the negative terminal, i.e., to the negative dc rail;

$C_T$—a single input control pin which controls both outputs $H_O$ and $L_O$;

$R_T$—(see FIG. 12) a pin which is connected to one node of a timing resistor;

$V_{CC}$—a pin which receives the chip's operating voltage, which in the circuit of FIG. 1 is an output voltage derived from the load output $V_O$ of the overall buck regulator circuit 10 and a dropping resistor $R_5$ from the dc bus voltage;

$V_B$—a pin connected to the diode D6 and the capacitor 12.

The control principle is to turn on Q1 for a fixed time, equal to the intrinsic delay of the IR 2152, and to vary the off period so that the output voltage is regulated to a constant value, independent of dc bus voltage or output current. Minimization of the ON period of Q1 to the intrinsic delay of the IR 2152 minimizes the size of the smoothing inductor.

Assume that $H_O$ is high, hence Q1 is driven ON. The voltage across the freewheeling diode D5, equal to the dc bus voltage when Q1 is ON, is fed back to the $C_T$ terminal of the IR 2152, via R1 and D3. D1 clamps the voltage applied to $C_T$ to $V_{CC}$.

After the intrinsic delay time of the IR 2152, Ho goes low, turning off Q1, and removing the bus voltage from the freewheeling diode. The voltage at $C_T$ decays at an initial rate determined by the internal capacitance of the $C_T$ terminal; however, this voltage does not drop below $(V_O+R3)/(R2+R3)$. $H_O$ stays low until the feedback voltage to $C_T$ falls to $V_{CC}/3$. After the intrinsic delay of the IR 2152, Ho goes high, and the cycle repeats.

Thus, a new ON period for Q1 is initiated each time the output voltage attempts to fall below a set value; by this mechanism, the output voltage is held essentially constant against changes in input voltage and output current.

A minimum output load of about 35 mA is needed to maintain continuous conduction in the 4.7 mH smoothing inductor 14, and ensure that the bootstrap capacitor is recharged.

Figure 2:
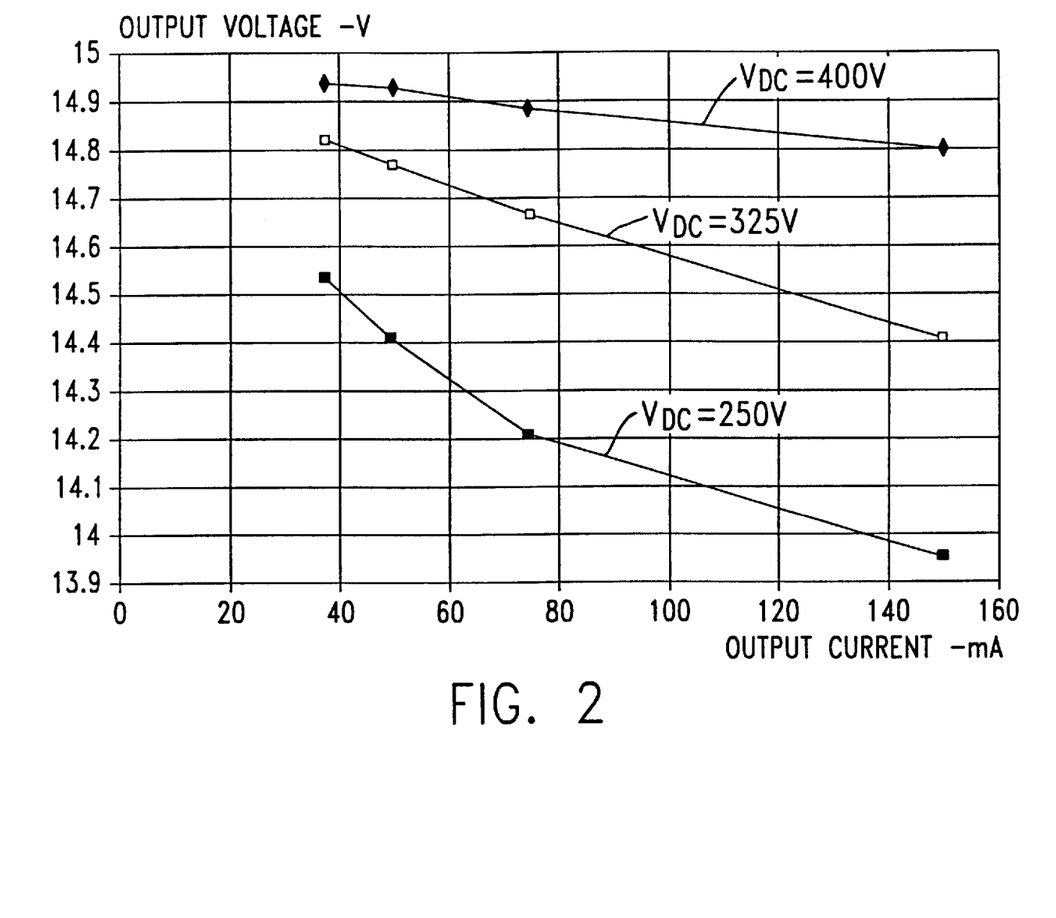
FIG. 2 shows the output voltage regulation versus load current and dc bus voltage for the first embodiment of the invention.
Figure 3A:
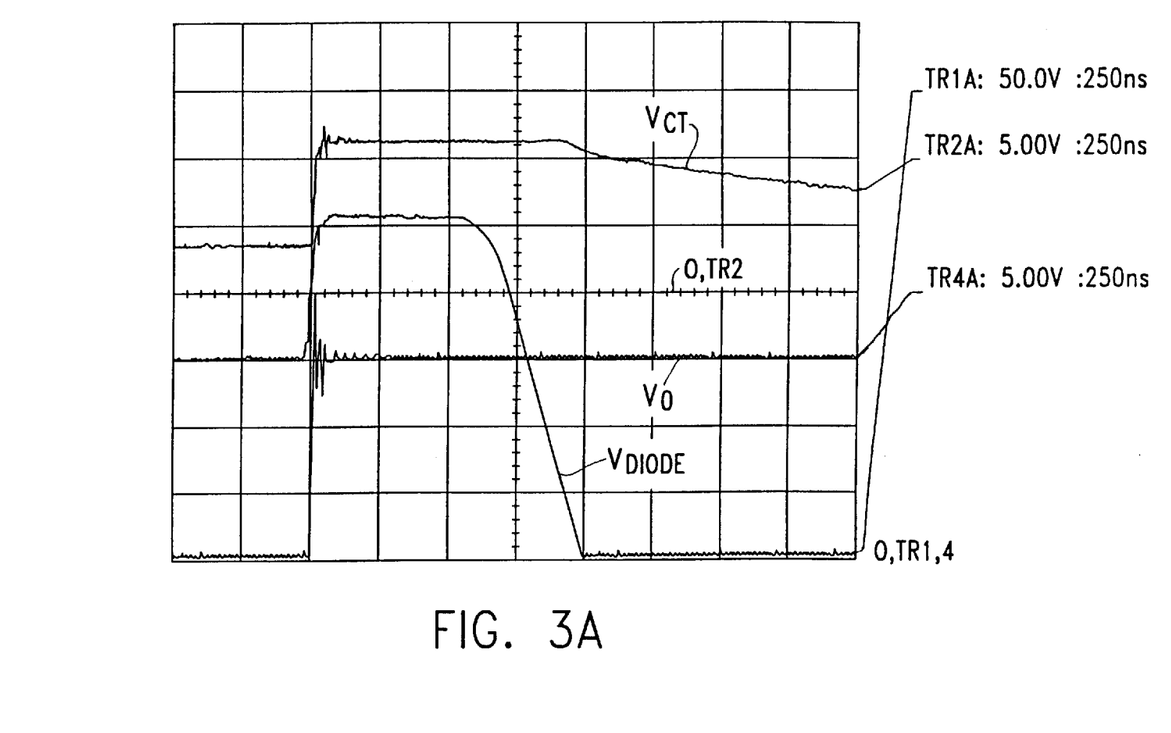
FIGS. 3–11 show oscillograms for various operating conditions.
Figure 3B:
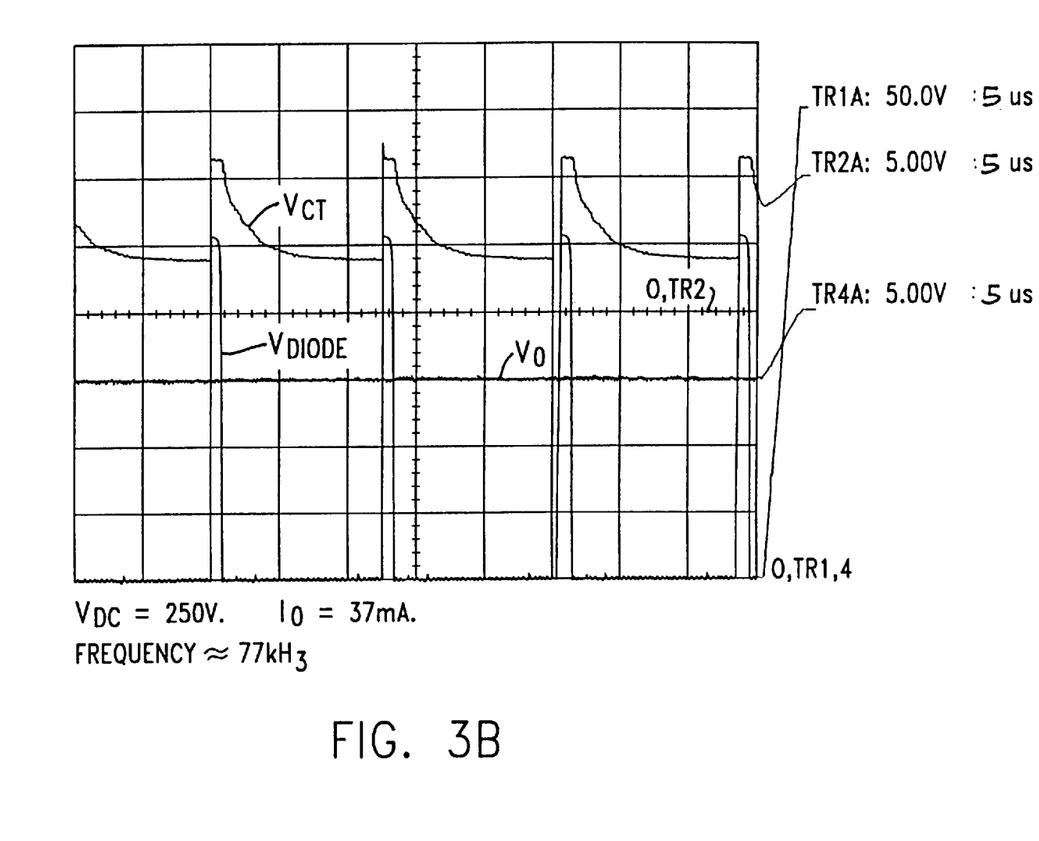

Output voltage regulation versus load current and dc bus voltage for the first embodiment of the invention is shown in FIG. 2.

The output voltage varies from 14.93 V at 400 V dc input and 37 mA output, to 14.13 V at 250 V dc input and 100 mA output. This 800 mV regulation is deemed acceptable. Note that the variation could be centered around a higher median—e.g. 15.4 V max/14.6 V min, by adjusting R2.

Figure 4A:
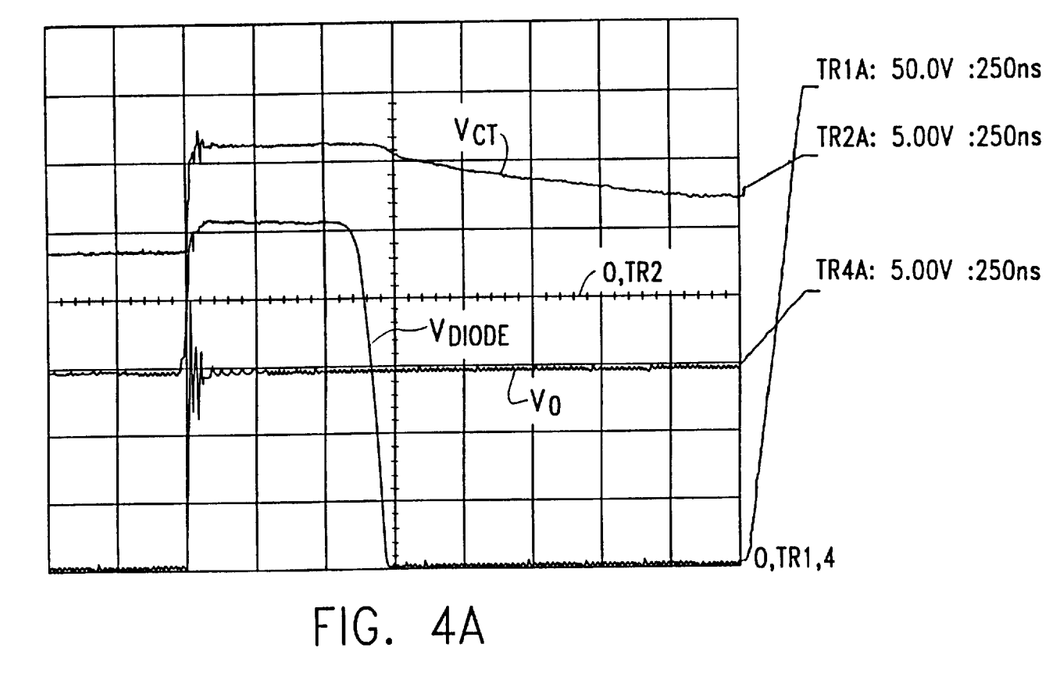
Figure 4B:
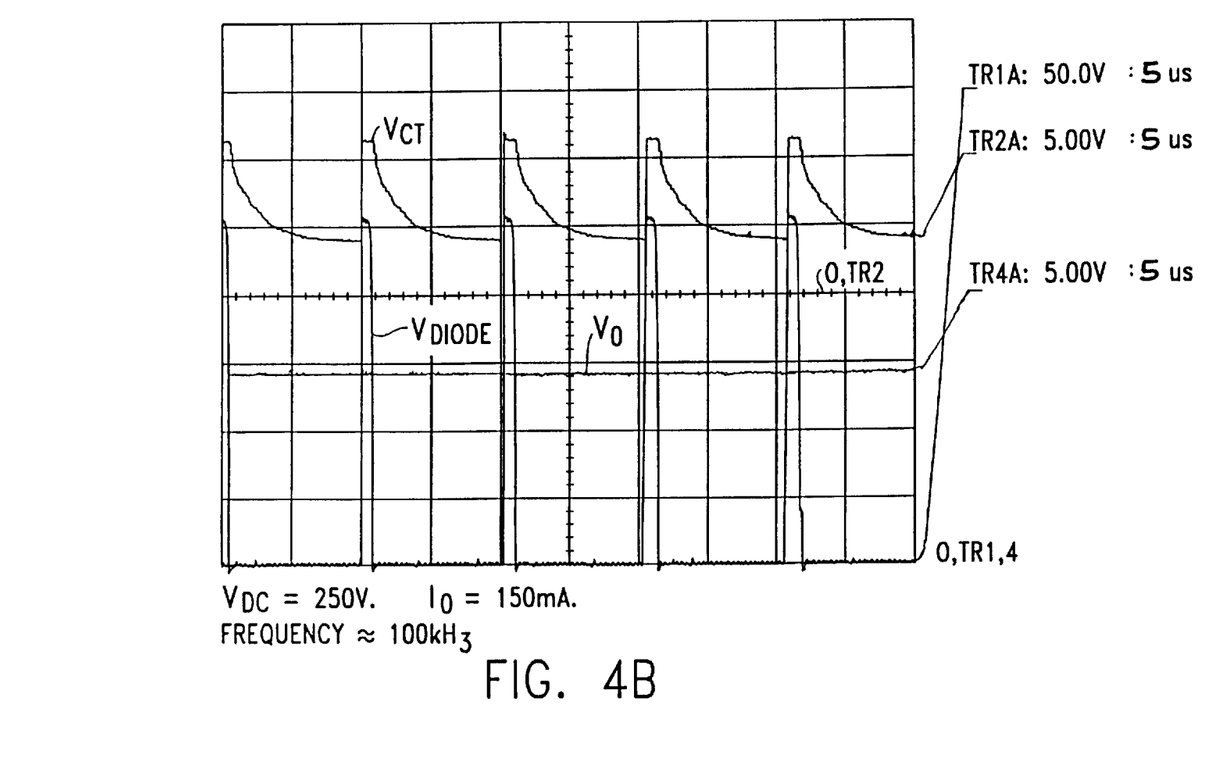
Figure 5A:
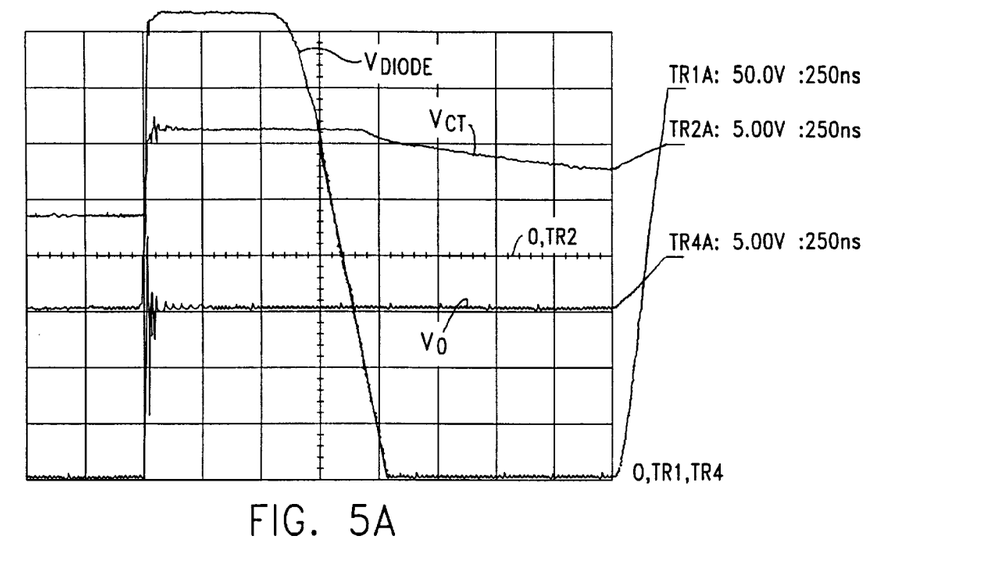
Figure 5B:
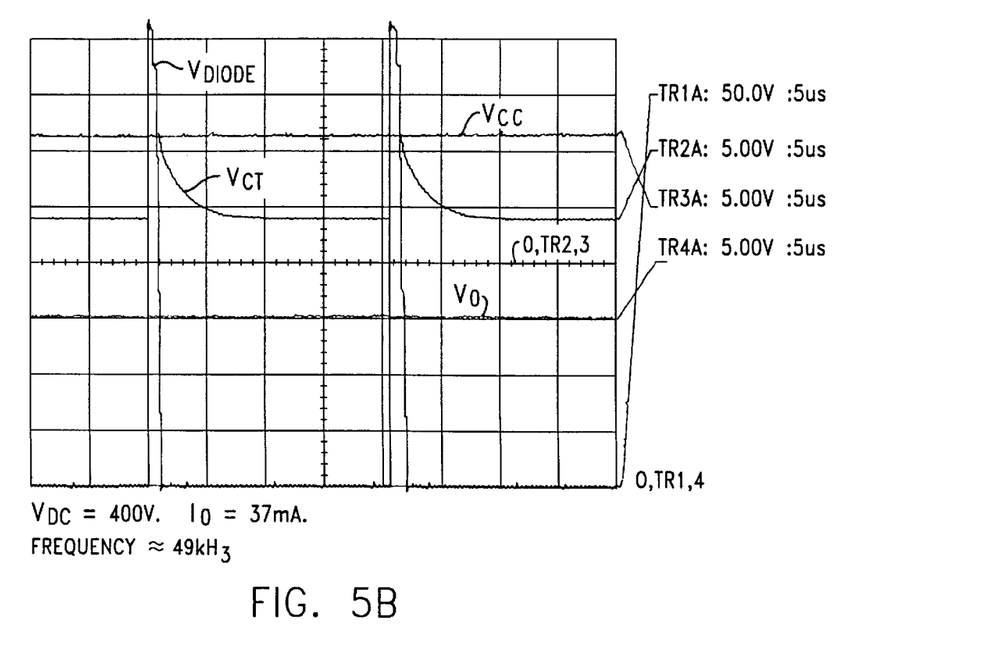
Figure 6A:
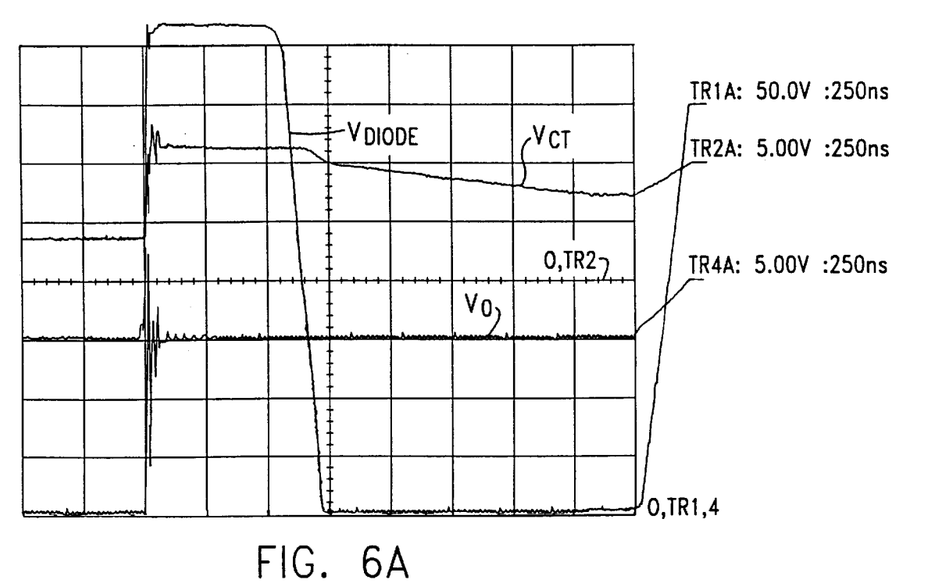
Figure 6B:
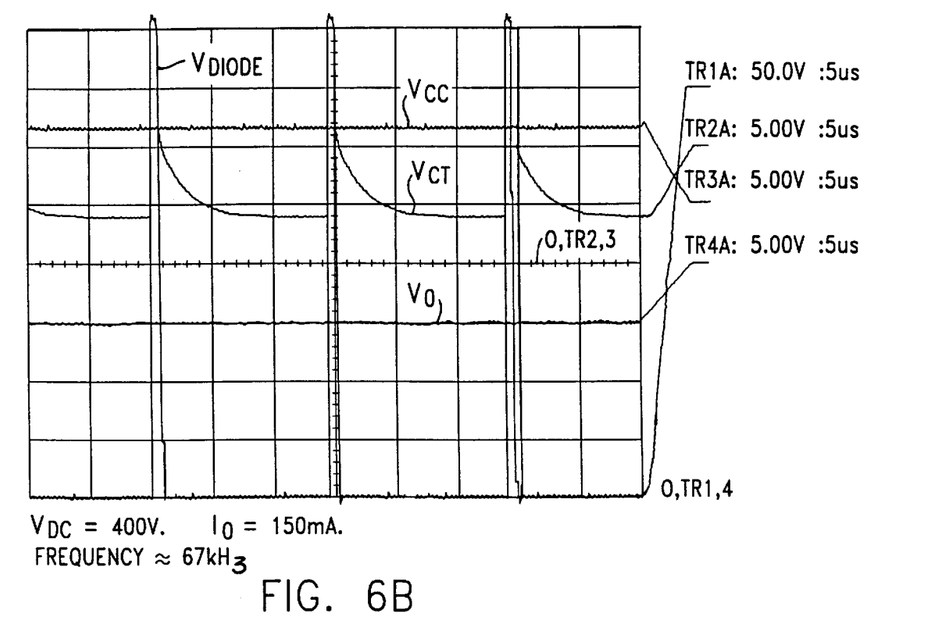
Figure 7A:
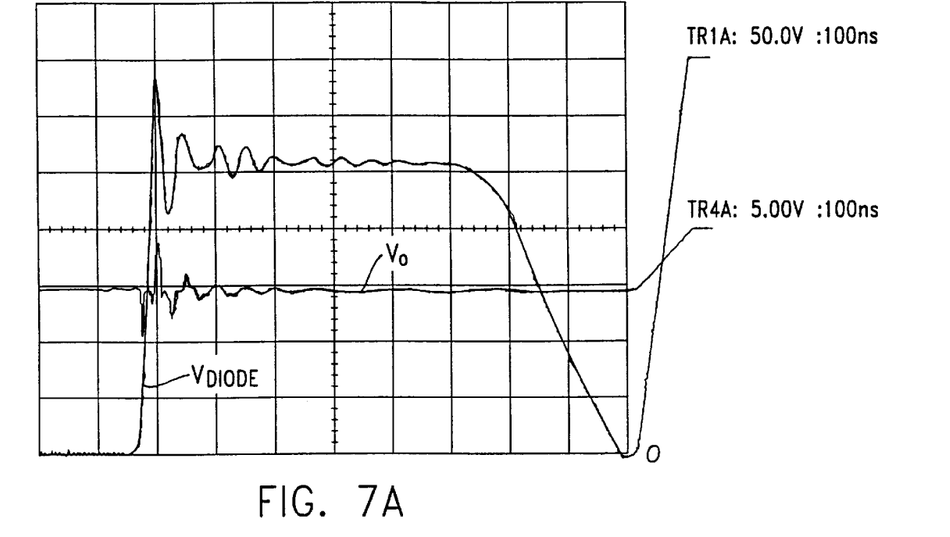
Figure 7B:
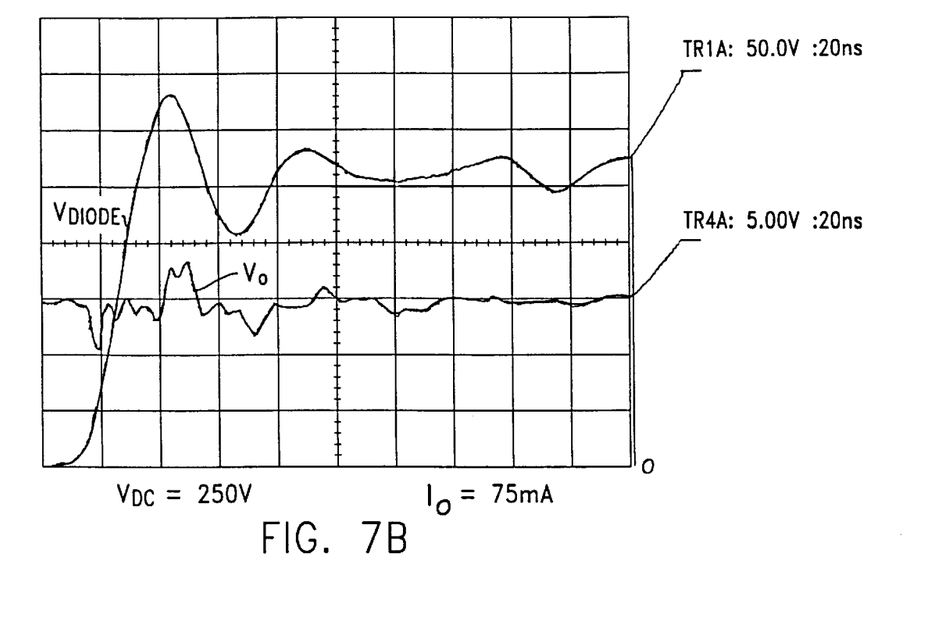
Figure 8A:
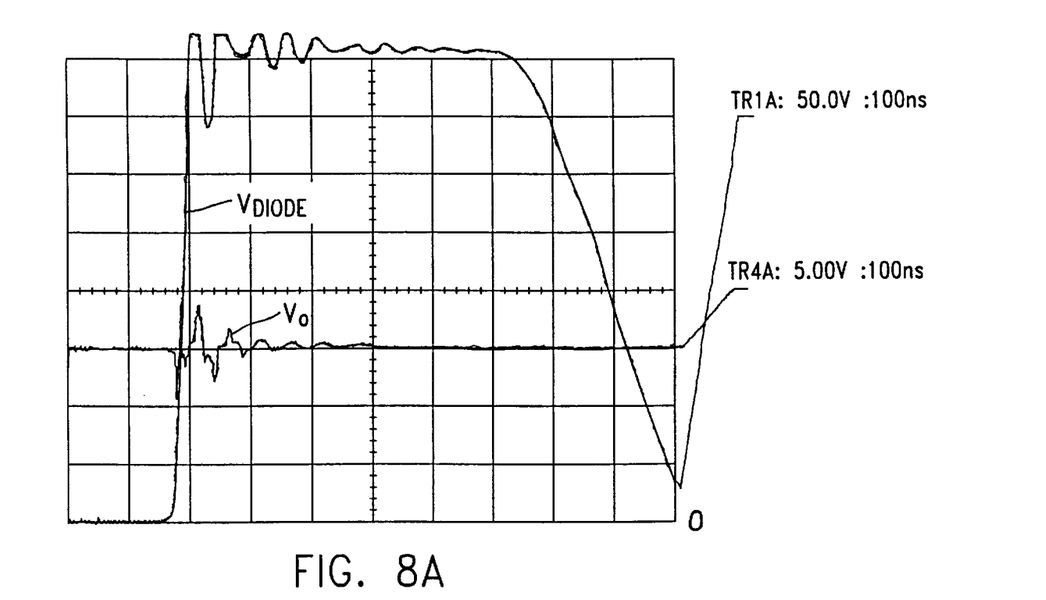
Figure 8B:
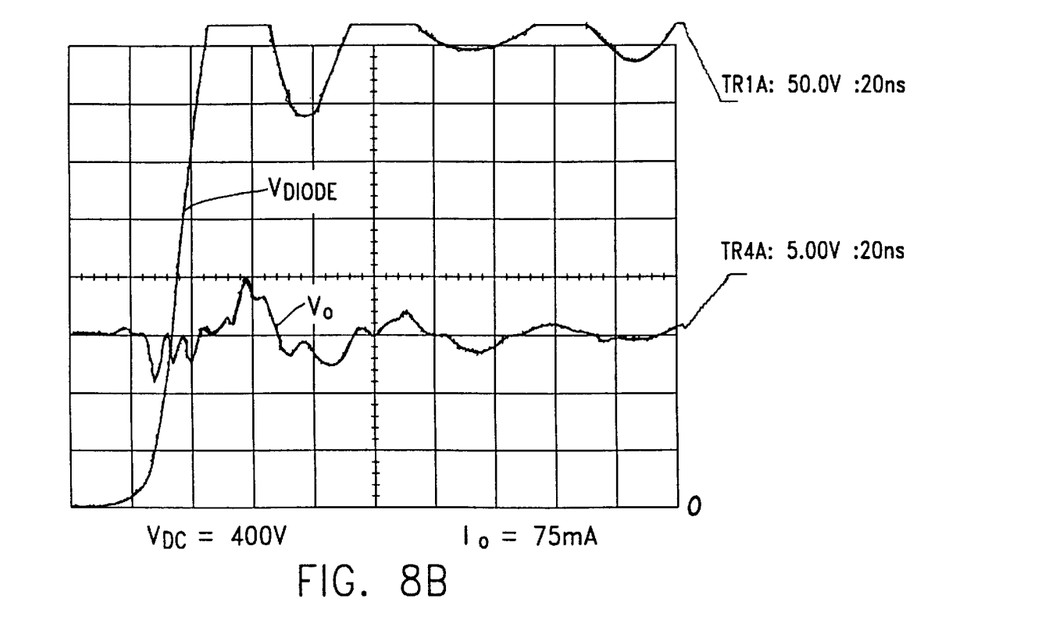

Oscillograms for various operating conditions are shown in FIGS. 3–11. The operating frequency varies from 49 kHz at minimum load, maximum dc bus voltage (FIG. 5) to 100 kHz at maximum load, minimum dc bus voltage (FIG. 4).

Figure 9A:
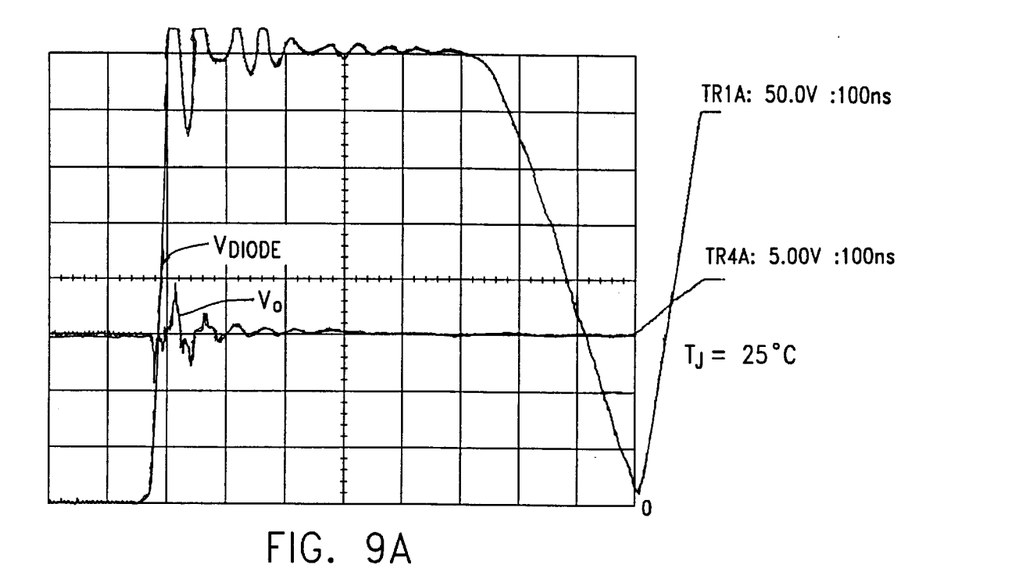
Figure 9B:
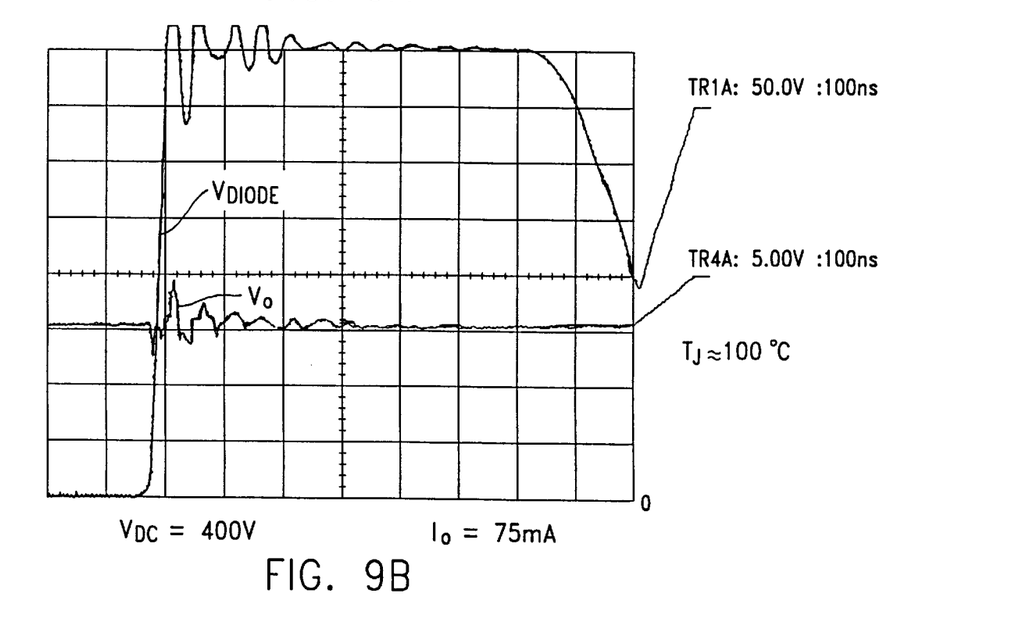
Figure 10A:
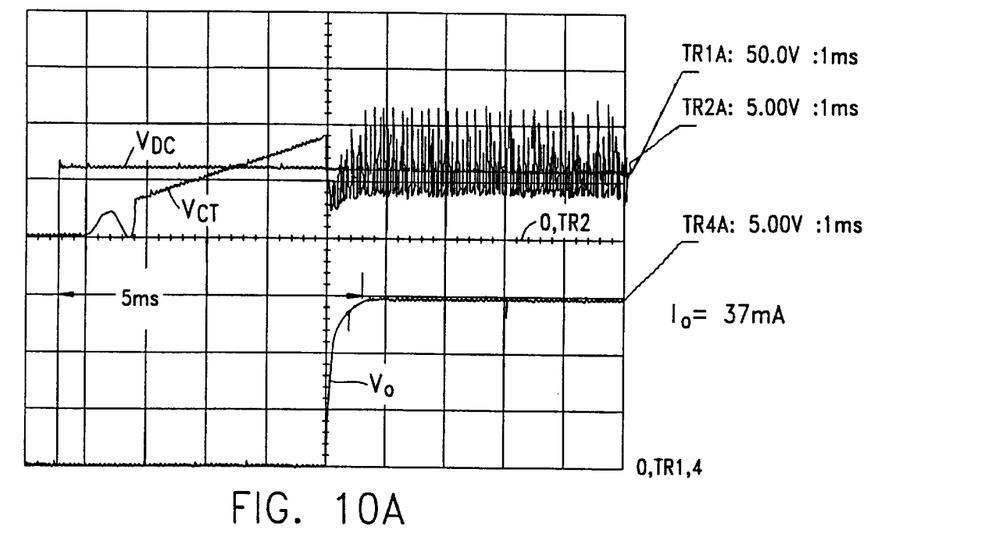
Figure 10B:
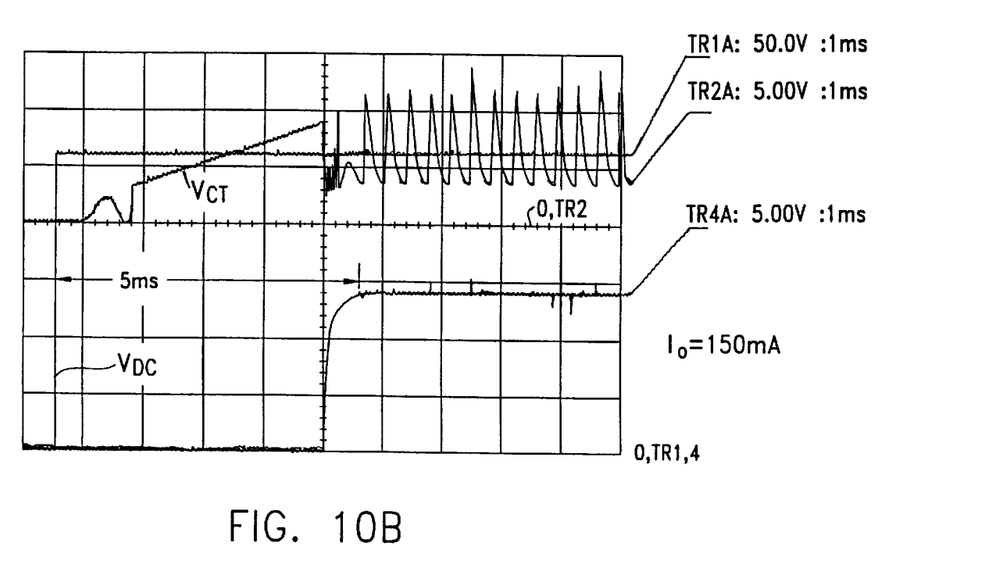
Figure 10C:
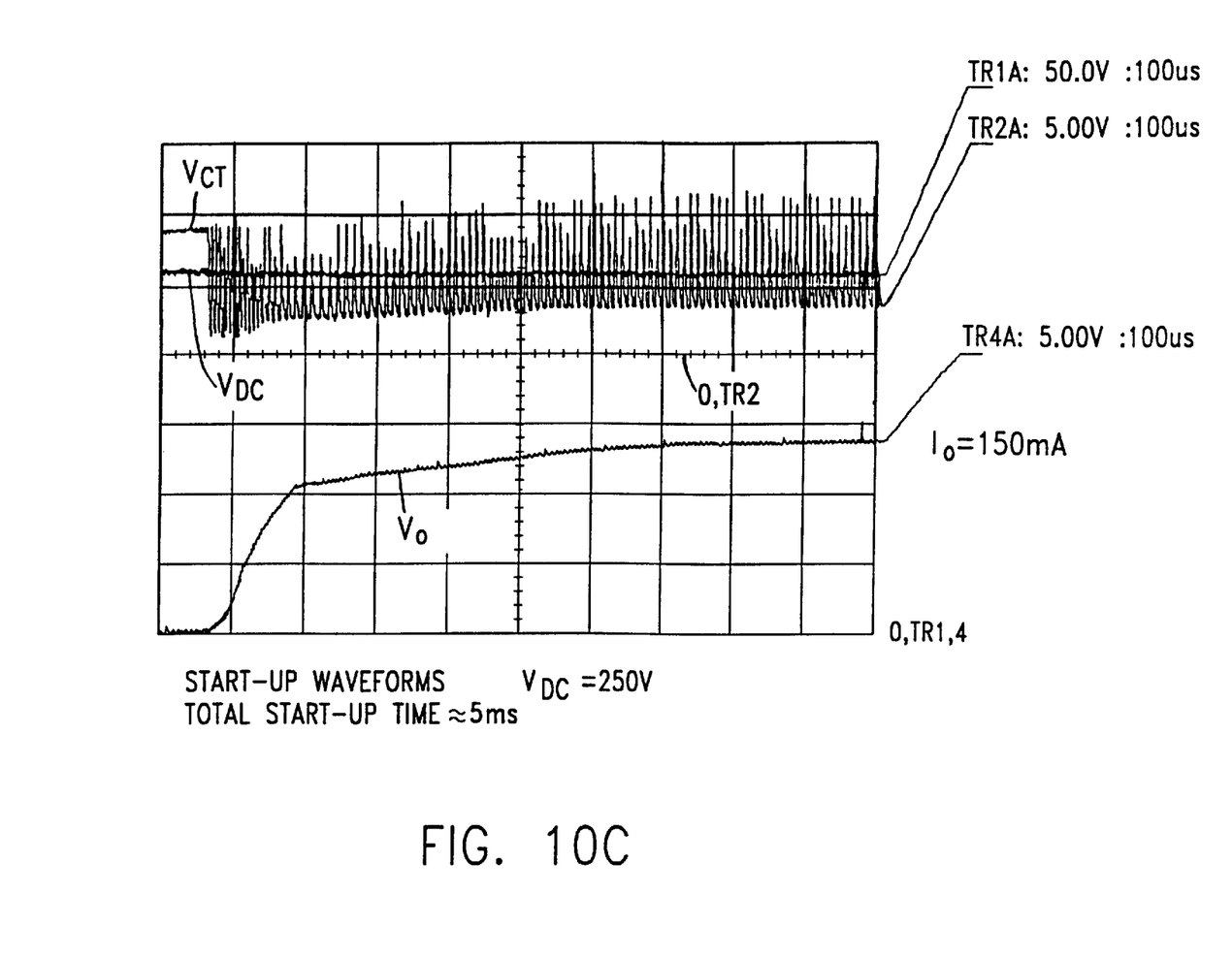
Figure 11A:
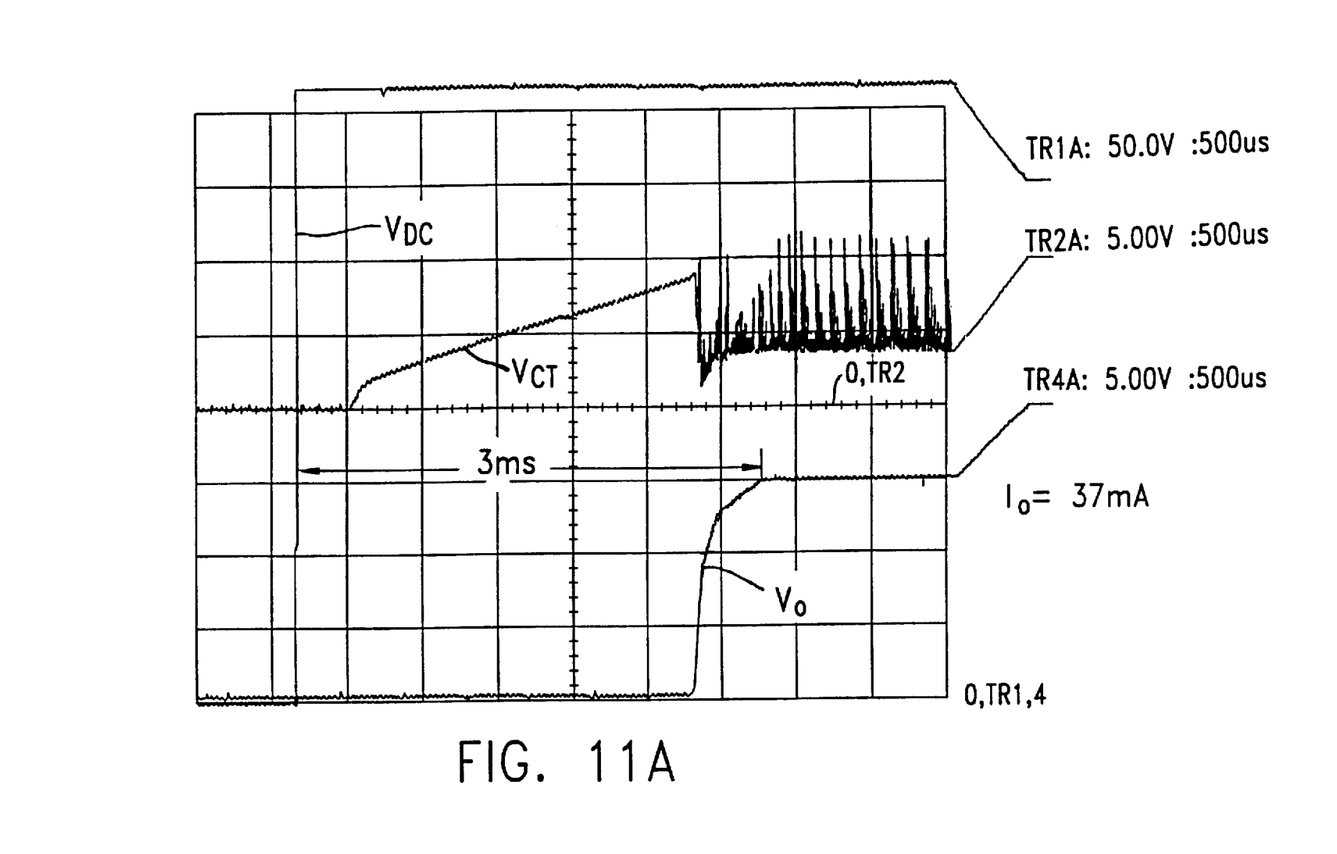
Figure 11B:
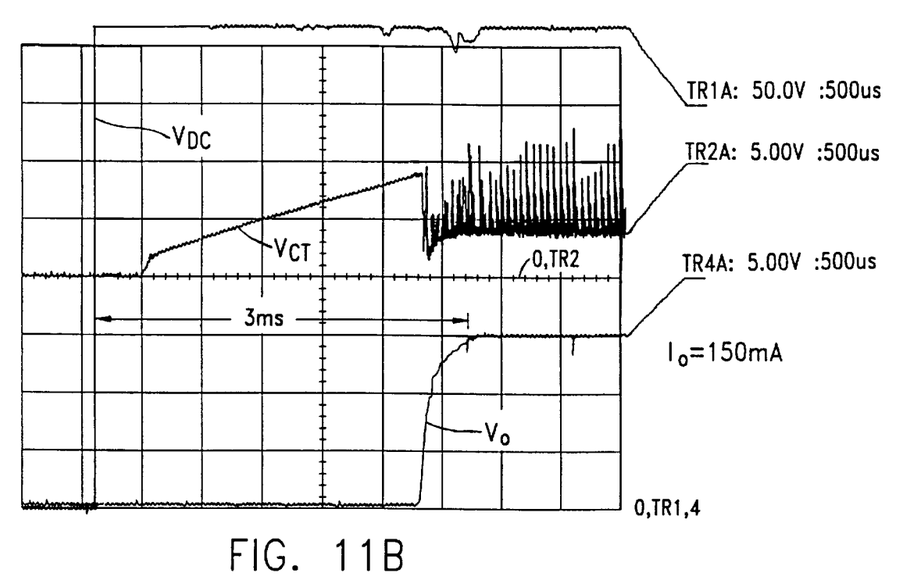
Figure 11C:
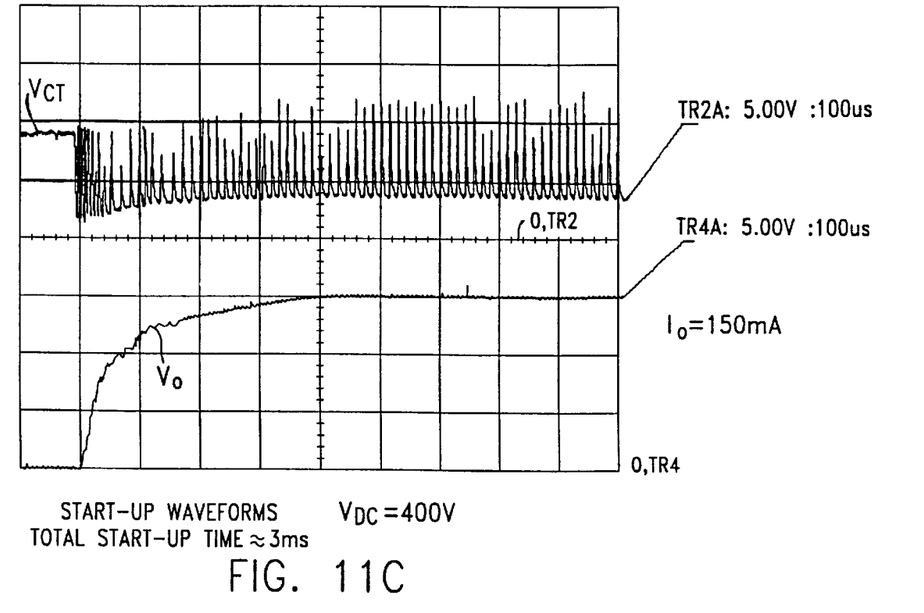

The oscillograms of FIG. 9 show that the ON time of Q1, set by the intrinsic delay of the IR 2152, varies from about 500 nS at 25° C. to 650 nS at 100° C. Total start up time, from dc bus voltage switch-on to 15 V output is about 5 ms at $V_{DC}$=250 V (FIG. 10) and 3 ms at $V_{DC}$=400 V (FIG. 11).

The circuit of FIG. 1 feeds back the 15 V output voltage of the regulator via R4/D4, to supplement the $I_C$ supply of the IR 2152. The zener Z1 sets $V_{CC}$ at 11 V, which allows a defined current to be fed back. R4/D4 and Z1 could be eliminated, at the expense of lower resistance and higher power loss in R5. Alternatively, if the IR 2152 was modified to include an 11 V zener (rather than the present 15.6 V zener), Z1 could be eliminated, though R4/D4 would still be retained.

The circuit of FIG. 1 does not operate well at low currents (e.g., less than 40 mA), because control is lost in the buck converter. A second embodiment of the present invention, shown in FIG. 12, eliminates zener Z1, diodes D1, D3 and D4, and resistors R1 and R4, and is advantageously stable under no load conditions.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A power regulator circuit, comprising:
   a positive input dc bus for supplying a comparatively high dc voltage ranging from a first to a second high dc voltage, the input high dc voltage being referenced to a low side common bus;
   a monolithic gate driver circuit powered by a low voltage power source referenced to the common bus;
   an inductor and a switching device connected between the input dc bus and the inductor through which the switching device delivers current to a load driving output terminal, the switching device including a gate terminal;
   the monolithic gate driver circuit including a gate driving output for driving the gate terminal of the switching device, the monolithic gate driver circuit having associated therewith an intrinsic predetermined delay time during which its gate driving output is active, upon being triggered by a triggering signal that is applied to a triggering electrode of the monolithic gate driver circuit; and
   a power regulating circuit coupled to the triggering electrode of the gate driver circuit for controlling the gate driver circuit so that the gate driving output is turned on for the duration of said intrinsic delay time and is then turned off for variable time periods which are controlled and vary so that the voltage at the load driving output terminal is maintained at a substantially constant, predetermined value.

2. The power regulator circuit of claim 1, in which the gate driver circuit includes a $V_{CC}$ terminal for receiving the low voltage power source and including a first resistor connected between the input dc bus and the $V_{CC}$ terminal.

3. The power regulator circuit of claim 2, further including a first series connected circuit including a second resistor and a diode connected between the $V_{CC}$ terminal and the load driving output terminal, for supplying additional current to the $V_{CC}$ terminal.

4. The power regulator circuit of claim 2, further including a voltage clamping circuit connected between the $V_{CC}$ terminal and the common bus for maintaining the $V_{CC}$ terminal at a predetermined clamping voltage.

5. The power regulator circuit of claim 4, in which the voltage clamping circuit comprises a zener diode.

6. The power regulator circuit of claim 2, in which the triggering electrode of the monolithic gate driver circuit is connected to the load driving output terminal via a second series connected circuit comprising a respective resistor and a respective diode.

7. The power regulator circuit of claim 2, further including a freewheeling diode connected between the switching device and the inductor, on the one hand, and the common bus on the other hand.

8. The power regulator circuit of claim 7, further comprising a third series connected circuit including a respective resistor and a respective diode connected between a cathode of the freewheeling diode and the triggering electrode of the monolithic gate driver circuit.

9. The power regulator circuit of claim 8, further comprising a further diode coupled between the voltage clamping circuit and the third series connected circuit to ensure that the voltage at the triggering electrode of the monolithic gate driver circuit does not rise above the predetermined clamping voltage.

10. The power regulator circuit of claim 2, in which the voltage at the load driving output terminal is regulated to supply a voltage of approximately 15 V at a current of from about 40 mA to about 100 mA.

11. The power regulator circuit of claim 2, in which the positive input dc bus has a voltage in a range from approximately 200 V to 450 V relative to the low side common bus.

12. The power regulator circuit of claim 2, in which the switching device is a MOSgate transistor.

13. The power regulator circuit of claim 2, in which the monolithic gate driver circuit comprises an International Rectifier 2152 integrated circuit.

* * * * *